United States Patent
Deeney et al.

(10) Patent No.: US 6,541,710 B1
(45) Date of Patent: Apr. 1, 2003

(54) METHOD AND APPARATUS OF SUPPORTING CIRCUIT COMPONENT HAVING A SOLDER COLUMN ARRAY USING INTERSPERSED RIGID COLUMNS

(75) Inventors: Jeffrey L. Deeney, Fort Collins, CO (US); David W. Mayer, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/991,430

(22) Filed: Nov. 16, 2001

(51) Int. Cl.$^7$ ................................................. H05K 1/03
(52) U.S. Cl. ..................... 174/255; 29/739; 257/697; 361/770
(58) Field of Search ................ 174/255, 267, 174/266, 263; 438/125; 257/781, 697, 780; 228/180.22; 29/739; 301/770, 772

(56) References Cited

U.S. PATENT DOCUMENTS

| | | | |
|---|---|---|---|
| 4,545,610 A | * 10/1985 | Lakritz et al. | 174/263 |
| 5,222,014 A | * 6/1993 | Lin | 29/739 |
| 5,244,143 A | 9/1993 | Ference | |
| 5,541,450 A | * 7/1996 | Jones et al. | 257/697 |
| 5,557,503 A | 9/1996 | Isaacs | |
| 5,615,735 A | 4/1997 | Yoshida | |
| 5,805,427 A | * 9/1998 | Hoffman | 361/770 |
| 5,926,370 A | 7/1999 | Cromwell | |
| 6,061,235 A | 5/2000 | Cromwell | |
| 6,084,178 A | 7/2000 | Cromwell | |
| 6,198,630 B1 | 3/2001 | Cromwell | |
| 6,231,333 B1 | 5/2001 | Gruber | |
| 6,235,996 B1 | 5/2001 | Farooq | |
| 6,276,596 B1 | 8/2001 | Gruber | |

OTHER PUBLICATIONS

Jeffrey L. Deeney, patent application filed on Nov. 16, 2001 titled Method And Apparatus For Supporting Circuit Component Having Solder Column Array Interconnects Using Interposed Support Shims, Attorney Docket No. 10015588–1, pp. 1–13 and 1 sheet of a drawing.

Jeffrey L. Deeney et al., patent application filed on Nov. 16, 2001 titled Method And Apparatus For Supporting A Circuit Component Having A Solder Column Interconnects Using An External Support, Attorney Docket No. 10015590–1, pp. 1–15 and 2 sheets of drawings.

* cited by examiner

Primary Examiner—Albert W. Paladini

(57) ABSTRACT

A column grid array integrated circuit package has a substrate. The substrate has a solder column array having a plurality of solder columns and a plurality of rigid columns interspersed with the solder columns at no-connect locations. The rigid columns contact a circuit board to which the column grid array integrated circuit package is mounted and support the column grid array integrated circuit package against compressive force.

12 Claims, 1 Drawing Sheet

METHOD AND APPARATUS OF SUPPORTING CIRCUIT COMPONENT HAVING A SOLDER COLUMN ARRAY USING INTERSPERSED RIGID COLUMNS

FIELD OF THE INVENTION

This invention relates to circuit components mounted on circuit boards by solder column interconnects or arrays, and more particularly, to column grid arrays and supporting them.

BACKGROUND OF THE INVENTION

Solder column interconnects or arrays are used to interconnect circuit packages to circuit boards, most typically large ceramic integrated circuit packages. One such package is the column grid array package that has a ceramic substrate with a series of solder columns that extend out from it, typically from the bottom surface. The solder columns are attached at one end to connection pads or locations on the ceramic substrate. The solder columns are sufficiently tall so that when the circuit package is placed on a circuit board, the solder columns can accommodate the difference in thermal expansion between the ceramic integrated circuit package and the printed circuit board. The solder columns are soldered to respective pads on the circuit board using known techniques, such as a convection reflow solder process.

One problem with solder column arrays is that the solder columns do not withstand compressive force well. The solder columns in the solder column arrays are typically made of a 90%/10% Pb/Sn solder, which is a soft material. Moreover, the individual solder columns are very thin. Consequently, if any significant amount of compressive force is applied to the circuit package, such as might be applied by a cooling solution such as a heat sink or fan, the resulting weight on the circuit package may cause the solder column array to compress, particularly over time, which may compromise reliability. In this regard, loads in excess of about 10 to 20 grams per column exert sufficient compressive force so that reliability may be compromised. Since CGA integrated circuit packages are being increasingly used for high power integrated circuits, the cooling solution required often has considerable mass. It is not unusual for the heat sink or cooling solution used with such high power integrated circuits to exceed one pound.

SUMMARY OF THE INVENTION

In accordance with the invention, a circuit package has connection locations or pads, some of which must be electrically connected to pads on a circuit board to which the circuit package is mounted and others of which do not. A solder column array has solder columns connected to the pads of the circuit package. In at least one of the no-connect locations, that is, the connection locations or pads of the circuit package that do not need to be electrically connected to a pad on the circuit board, a rigid column is affixed to the connection pad in lieu of a solder column. In an aspect of the invention, a plurality of rigid columns are interspersed throughout the solder column array in at least some of the no-connect locations. The rigid column or columns extend between the circuit package and the circuit board and support the circuit package against compressive force. In an aspect of the invention, the rigid columns are attached to respective connection pads of the circuit package at the no-connect locations but not soldered to respective connection pads on the circuit board.

In an aspect of the invention, the circuit package is a column grid array having a two dimensional solder column array having a plurality of solder columns with rigid columns interspersed therewith, the rigid columns being in no-connect locations.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawing wherein FIG. 1 an exploded side view of a column grid array integrated circuit package and printed circuit board.

DETAILED DESCRIPTION

Figure 1:
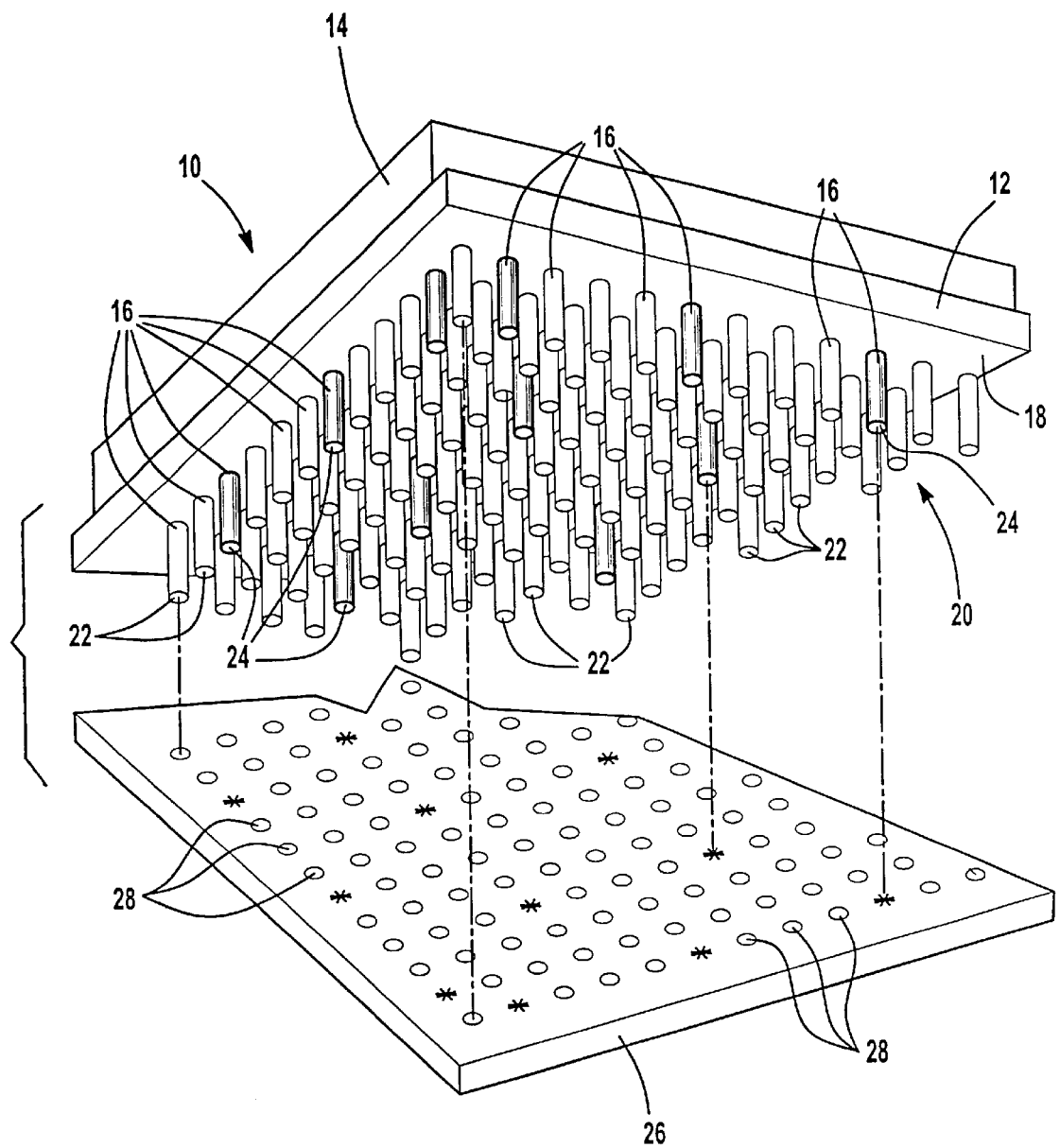

The following detailed description merely exemplary in nature and is in no way intended to limit the invention, its application, or uses.

Referring to FIG. 1, a CGA integrated circuit package 10 in accordance with the invention is shown. It should be understood that while the invention is described as implemented in CGA integrated circuit package, it is not limited to CGA integrated circuit packages and can be utilized on any circuit package having a solder column array. CGA integrated circuit package 10 can be a CPU package but can also be other types of circuit packages, such as ASICs (application specific integrated circuits).

CGA integrated circuit package 10 has a ceramic substrate 12 and a package lid 14. A plurality of connection terminals or pads 16 are disposed in a grid on a bottom side 18 of ceramic substrate 12. A solder column array 20 extends from the bottom side 18 of ceramic substrate 12. Solder column array 20 has a plurality of solder columns 22 attached at one side to respective ones of connection pads 16. Interspersed among solder columns 22 are rigid columns 24. Rigid columns 24 are attached at one side to respective ones of connection pads 16 that are at "no-connect" locations. As used herein, a "no-connect" location is a location where the connection pad 16 need not be connected to a circuit board 26 when CGA integrated circuit package 10 is mounted on circuit board 26. It should be understood that while a rigid column can be provided at each no-connect location, it is not necessary to do so and fewer rigid columns than no-connect locations can be utilized as long as a sufficient number of rigid columns are provided to support CGA integrated circuit package 10 and the cooling solution mounted to it.

As is known, a given size CGA integrated circuit package typically has a given number of connection pads 16. However, the integrated circuits packaged in that size CGA package often do not utilize all the connection pads 16 of the CGA package. That is, some of the connection pads 16 are not connected to the integrated circuit packaged in that CGA package and thus need not be connected to the circuit board on which the CGA is mounted.

When CGA integrated circuit package 10 is mounted on circuit board 26, solder columns 22 of solder column array 20 are soldered to respective connection pads 28 on circuit board 26, which is illustratively a printed circuit board. However, rigid columns 24 are preferably not soldered to respective connection pads 28 on circuit board 26 to accommodate the difference in thermal expansion between CGA integrated circuit package 10 and circuit board 26. In this regard, connection pads 28 might not be formed on circuit board 26 at the locations that correspond to rigid columns 24 since the rigid columns 24 are preferably not soldered to the respective connection pads 28.

Rigid columns 24 are illustratively made of material that can be brazed to their respective connection pads 16. In this regard, high phosphor bronze wire, or NI-GPAN-C wire or pins, such as wire or pins made of Kovar material available from Carpenter Technology Corporation, Wyomissing, Pa., can illustratively be used for rigid columns 24. However, it should be understood that rigid columns 24 can be made of any material that is sufficiently rigid to support CGA integrated circuit package 10 and the cooling solution (e.g., heat sink or fan) that is mounted on CGA integrated circuit package 10.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of supporting on a circuit board a circuit component having a solder column array, the circuit component having at least one no-connect location, the method comprising providing a rigid column between the circuit component and the circuit board in the at least one no-connect location.

2. The method of claim 1, wherein the circuit component has a plurality of no-connect locations and a rigid column is provided between the circuit component and the printed circuit board in at least some of the no-connect locations.

3. The method of claim 1 wherein the rigid columns are made from at least one of high phosphor bronze and Kovar.

4. A method of supporting on a printed circuit board a column grid array integrated circuit package having a solder column array, the column grid array integrated circuit package having at least one no-connect location, the method comprising the step of providing a rigid column between the printed circuit board and the column grid array integrated circuit package in the at least one no-connect location.

5. The method of claim 4 wherein the rigid column is affixed to the column grid array integrated circuit package in the at least one no-connect location.

6. The method of claim 4, wherein the column grid array integrated circuit package has a plurality of no-connect locations and a rigid column is placed between the printed circuit board and the integrated circuit component in at least some of the no-connect locations.

7. The method of claim 6 wherein the rigid columns are made from at least one of high phosphor bronze and Kovar.

8. An integrated circuit package having a substrate, the substrate having a plurality of connection pads on a bottom surface disposed in a grid, a plurality of the connection pads being at no-connect locations, a solder column array having a plurality of solder columns and a plurality of rigid columns interspersed with the solder columns, the solder columns attached to connection pads on the bottom of the substrate of the integrated circuit package that are not at no-connect locations, and the rigid columns attached to connection pads on the bottom of the substrate that are at no-connect locations.

9. The apparatus of claim 8, wherein the rigid columns are made from at least one of high phosphor bronze and Kovar.

10. A column grid array integrated circuit package having a substrate, the substrate having a solder column array, the solder column array having a plurality of solder columns and a plurality of rigid columns interspersed with the solder columns at no-connect locations.

11. The apparatus of claim 10, wherein the solder column array includes a rigid column at each no-connect location.

12. The apparatus of claim 10, wherein the rigid columns are made from at least one of high phosphor bronze and Kovar.

* * * * *